United States Patent [19]
Torihata et al.

[11] Patent Number: 5,564,616
[45] Date of Patent: Oct. 15, 1996

[54] WIRE BONDING APPARATUS

[75] Inventors: Minoru Torihata, Kita-machi; Shinji Maki, Fussa, both of Japan

[73] Assignee: Kabushiki Kaisha Shinkawa, Tokyo, Japan

[21] Appl. No.: 416,995

[22] Filed: Apr. 5, 1995

[30] Foreign Application Priority Data

Apr. 7, 1994 [JP] Japan ................... 6-093792

[51] Int. Cl.[6] .............................................. H01L 21/60
[52] U.S. Cl. ................... 228/4.5; 228/180.5; 242/147 A
[58] Field of Search .................... 228/4.5, 9, 102, 228/103, 180.5; 242/147 A, 157 R; 156/73.2

[56] References Cited

U.S. PATENT DOCUMENTS

| | | | |
|---|---|---|---|
| 4,019,669 | 4/1977 | Tanimoto et al. | 228/4.5 |
| 4,498,638 | 2/1985 | Kurtz et al. | 242/45 |
| 4,763,826 | 8/1988 | Kulicke, Jr. et al. | 228/4.5 |
| 4,909,431 | 3/1990 | Japachino et al. | 228/4.5 |
| 5,016,803 | 5/1991 | Ohashi et al. | 228/4.5 |

FOREIGN PATENT DOCUMENTS

| | | | |
|---|---|---|---|
| 53-9949 | 4/1978 | Japan | H01L 21/60 |
| 53-10425 | 4/1978 | Japan | H01L 21/60 |
| 61-41231 | 11/1986 | Japan | H01L 21/60 |

*Primary Examiner*—Samuel M. Heinrich
*Attorney, Agent, or Firm*—Koda & Androlia

[57] ABSTRACT

A device for applying tension to a bonding wire installed between a wire spool and a capillary of a wire bonding apparatus including a nozzle for blowing out a gas for applying tension to the wire and a single gas guide plate installed along the direction of the flow of the gas blown out of the nozzle so as to guide the gas to the bonding wire.

4 Claims, 5 Drawing Sheets

WIRE BONDING APPARATUS

BACKGROUND OF THE INVENTION

1. Field of the Invention

The present invention relates to a wire bonding apparatus and more specifically to an improved tension applying means which applies a constant tension to the wire in the wire bonding apparatus.

2. Prior Art

Conventional examples of tension applying means used in wire bonding devices are disclosed in Japanese Patent Application Publication (Kokoku) Nos. 53-9949 (called "Conventional Example 1"), 53-10425 (called "Conventional Example 2"), and 61-41231 (called "Conventional Example 3"). FIG. 5 illustrates Conventional Example 1, FIG. 6 illustrates Conventional Example 2 and FIG. 7 illustrates Conventional Example 3.

Conventional Examples 1 through 3 all include nozzles 1 each having a nozzle hole 1a that blows out a gas and two gas guide plates 2 and 3 which are installed along the direction of flow of the gas blown out of the nozzle 1. In Conventional Example 1, ducts 5 are formed in the gas guide surfaces 4 of the two gas guide plates 2 and 3. The cross sections of these ducts 5 becomes wider toward the nozzle 1 and narrower away from the nozzle 1.

In Conventional Examples 2 and 3, the gas flows between the two gas guide plates 2 and 3. Accordingly, as shown in FIG. 8, the gas 6 can be pushed out in the direction of width of the gas guide plates 2 and 3 (i.e., in the direction perpendicular to the direction of the center line of the nozzle 1). Thus, the gas is not stable in the direction of blowing. As a result, the bonding wire 7 is caused to swing violently in the direction of width of the gas guide plates 2 and 3 so that the wire 7 is applied with stress, which is not desirable. Furthermore, since the wire 7 swings violently in the direction of width of the guide plates 2 and 3, the paying out of the wire from the spool is not accomplished smoothly.

In addition, since two gas guide plates 2 and 3 are used in Conventional Examples 1 through 3, contamination of the inside surfaces of the gas guide plates 2 and 3 cannot easily be observed, and the gas guide plates 2 and 3 are not cleaned unless one of the gas guide plates is removed. Moreover, since two gas guide plates 2 and 3 are used, the number of parts required in the apparatus is high, and the apparatus is more expensive. Particularly in the case of Conventional Example 1, since the specially shaped ducts 5 of the guide plates are designed so as to be wider toward the nozzle 1 and narrower away from the nozzle 1, the cost of the apparatus is greatly increased.

SUMMARY OF THE INVENTION

Accordingly, the object of the present invention is to provide a wire bonding apparatus in which the gas flow can be stable so that no oscillation of the wire occurs, gas guide plate contamination can be ascertained easily and can be cleaned very easily, and the cost of manufacture can be low.

The objects of the present invention are accomplished by a unique structure for a wire bonding apparatus equipped with a tension applying means that is installed between a spool around which a wire is wound and a capillary so as to apply tension to the wire and is comprised of a nozzle for blowing out a gas and a gas guide means installed along the direction of flow of the gas blown out of the nozzle, and the unique structure of the invention is that the gas guide means of the tension applying means consists of a single plate.

The objects of the present invention are accomplished by another unique structure for a wire bonding apparatus equipped with the tension applying means as described above, and the unique feature is that the tension applying means is further provided with a pair of wire guide pins and a wire guide rod wherein: the wire guide pins are installed above the gas guide plate so that the wire payed out of the spool is moved along the gas guide surface of the gas guide plate and so that the wire guide pins are parallel to the plane of the gas guide surface of the gas guide plate and has a fixed distance on either side of the center of the nozzle; and the wire guide bar is installed beneath the gas guide plate so as to be parallel to the plane of the gas guide surface of the gas guide plate, with the side-surface of the wire guide bar being in the same plane as the gas guide surface of the gas guide plate.

With the structures as described above, the gas blown out of the nozzle flows along the single gas guide plate so that tension is applied to the wire that faces the gas flow. Since the gas guide means consists of a single plate, the gas from the nozzle forms a stable flow along the gas guide surface of the gas guide plate. More specifically, since gas does not flow in a path defined between two gas guide plates as in conventional devices, the wire is not pushed out in the direction of width of the gas guide plate, and the oscillation of the wire can be minimized. Furthermore, since only a single gas guide plate is used, the conditions of contamination can be observed easily, and cleaning can easily be performed. Thus, the apparatus of the present invention is superior in terms of ease of maintenance.

In addition, there is no need to pass the wire between two plates as in the prior art; as a result, the amount of work required is significantly low. Moreover, since only a single gas guide plate is used, the number of parts required is reduced compared with the prior art devices, and manufacturing costs can be reduced.

In addition, a pair of wire guide pins are installed above the gas guide surface of the gas guide plate, and a wire guide bar is installed beneath the gas guide surface. Accordingly, the wire can be in contact with at least two points (with the wire guide bar and with the spool or the wire guide pins), thus the wire can constantly be maintained in a stable state.

DETAILED DESCRIPTION OF THE INVENTION

Figure 1:
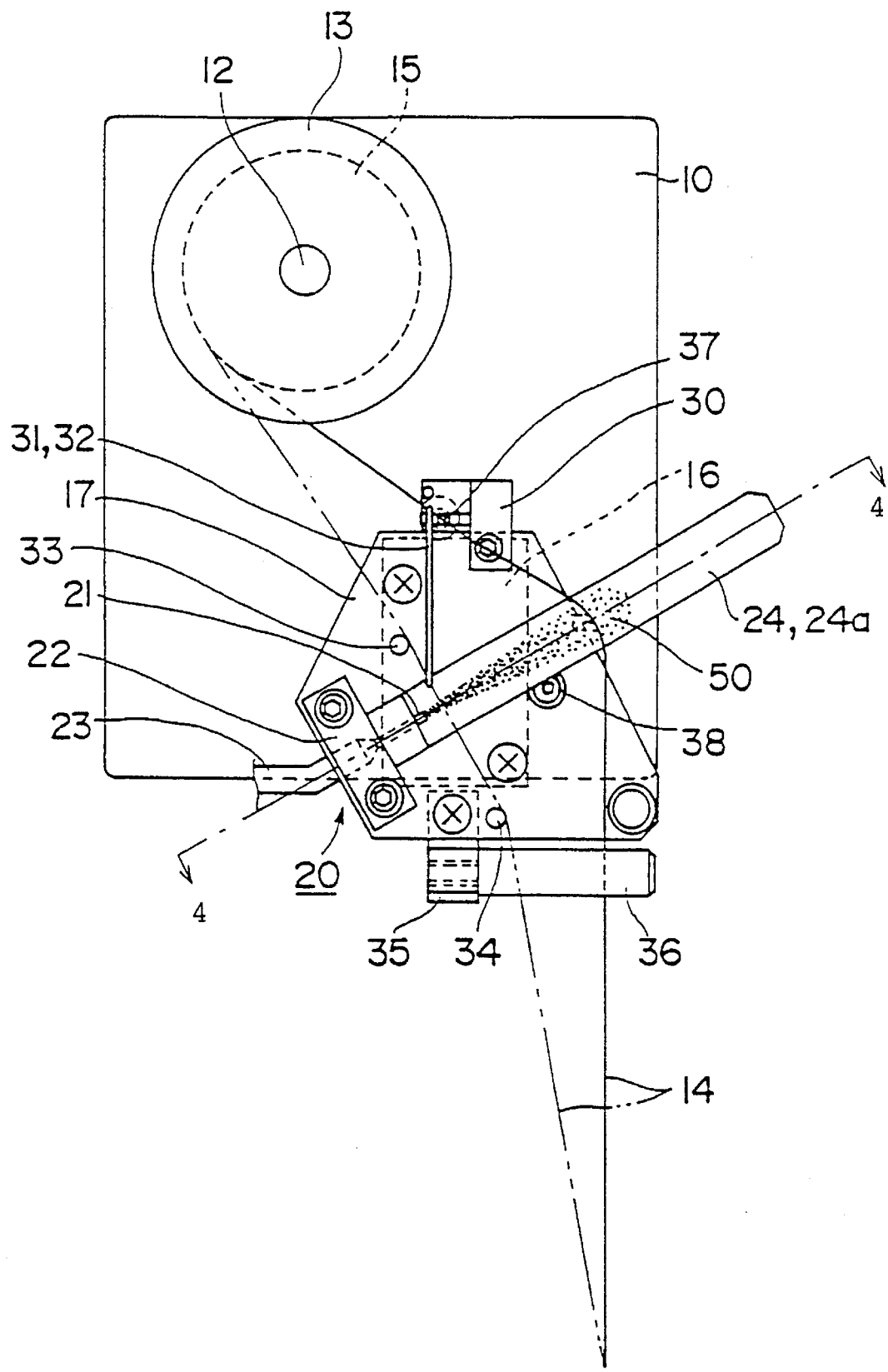
FIG. 1 is a front view of essential parts of one embodiment of the tension applying means used in the wire bonding apparatus of the present invention.

One embodiment of the present invention will be described below with reference to FIGS. 1 through 4.

A spool motor 11 is installed in a box 10 which is fastened to the bonding head of a wire bonding apparatus (not shown), and a spool shaft 12 is fastened to this spool motor 11. A spool holder 13 is fastened to the spool shaft 12, and a spool 15 around which a bonding wire 14 is wound is attached to the spool holder 13 in a freely detachable manner. In addition, a supporting plate 17 is fastened via a block 16 to the box 10 so that the plate 17 is located beneath the spool shaft 12, and a tension applying means 20 which applies tension to the wire 14 is mounted to the supporting plate 17.

The tension applying means 20 includes a nozzle 21 fastened to a nozzle holder 22 which is fastened to the supporting plate 17. The nozzle 21 is installed so as to be inclined obliquely upward. In other words, the opening of the nozzle 21 faces towards the upper right corner in FIG. 1. The opposite end of the nozzle 21 is connected to a pipe 23 that supplies a gas to the nozzle 21. The pipe 23 is connected to a gas supply source such as a compressor (not shown), etc., which supplies a gas such as air, an inert gas, etc. to the pipe 23. Furthermore, a single gas guide plate 24 is fastened to the nozzle holder 22. The gas guide plate 24 has a gas guide surface 24a that extends along the direction of the flow of the gas blown out of the nozzle 21

Figure 3:
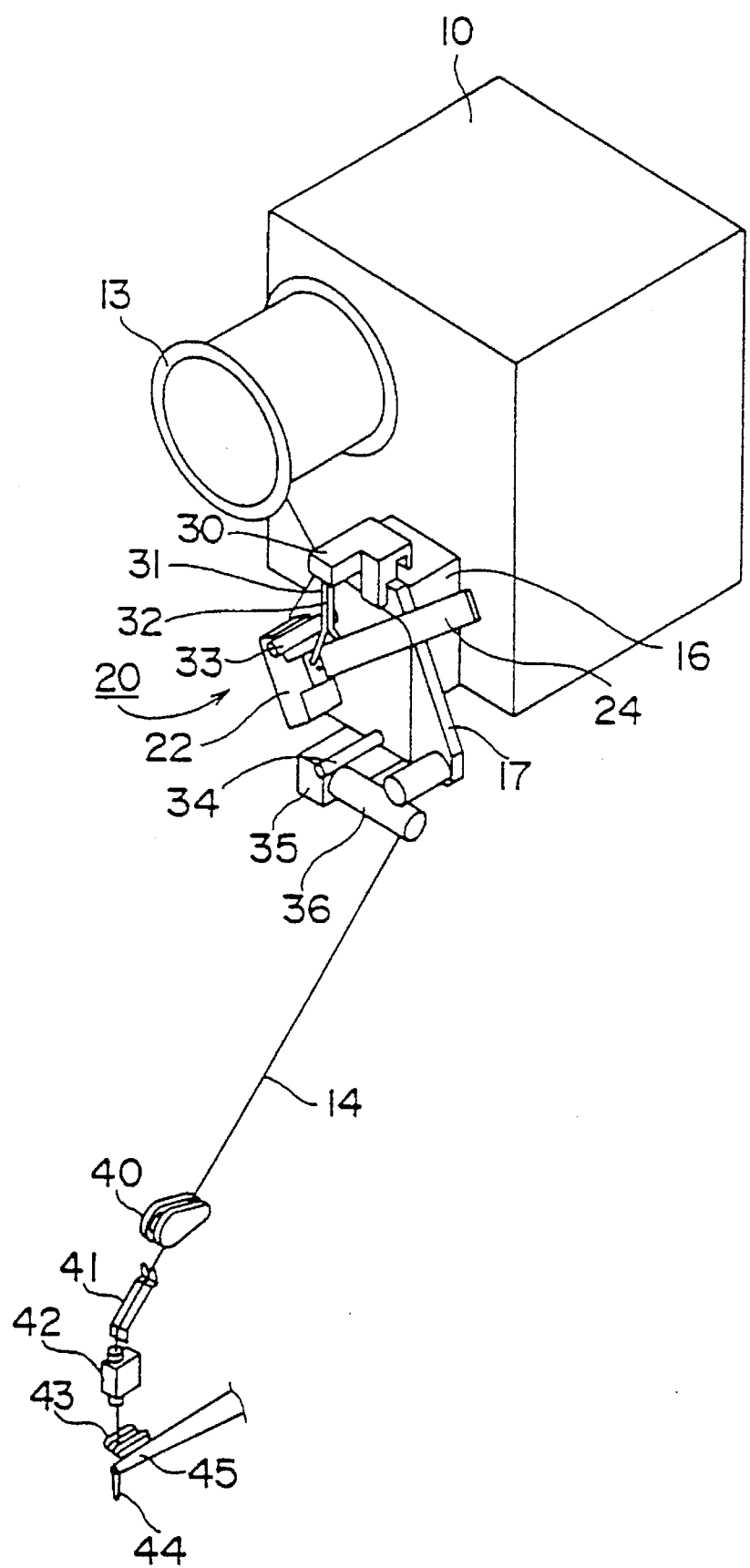
FIG. 3 is a perspective view showing the schematic construction of one embodiment of the wire bonding apparatus of the present invention.
Figure 4:
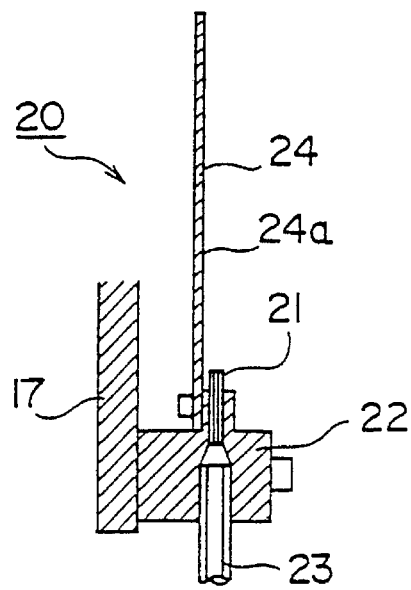
FIG. 4 is a cross section taken along line 4—4 in FIG. 1.
Figure 5:
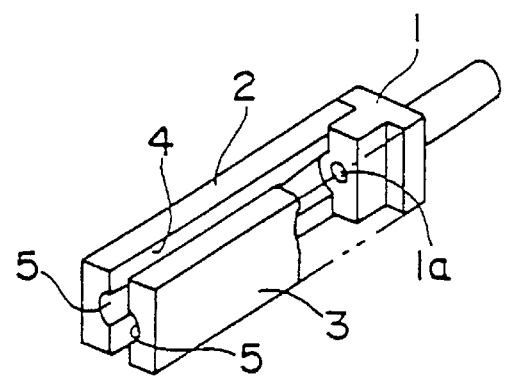
FIG. 5 is a perspective view of the first conventional example of tension applying means.
Figure 6:
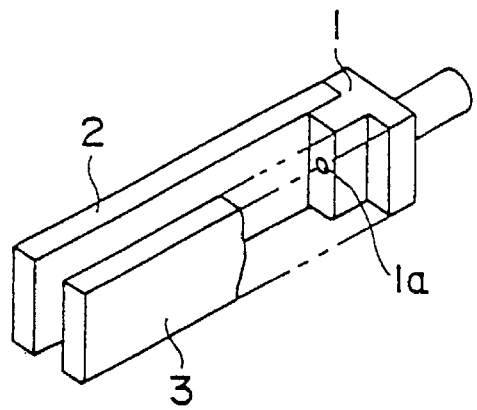
FIG. 6 is a perspective view of the second conventional example of tension applying means.
Figure 7:
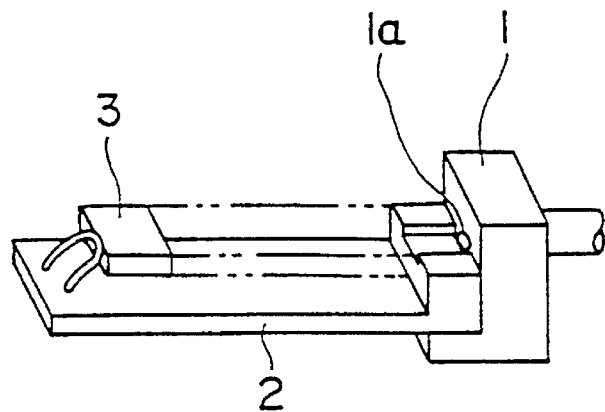
FIG. 7 is a perspective view of the third conventional example of tension applying means.
Figure 8:
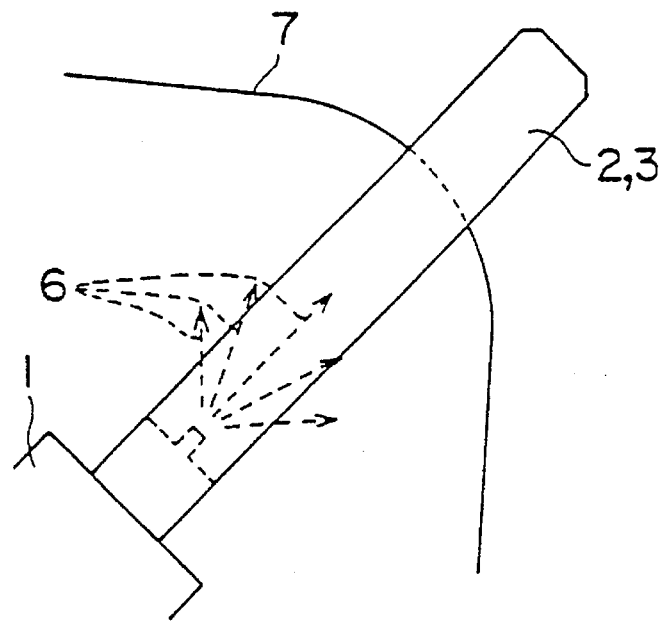
FIG. 8 is an explanatory diagram which illustrates drawbacks of the second and third examples.

A guide pin holder 30 is fastened to the upper part of the supporting plate 17, and a pair of wire guide pins 31 and 32 are mounted to the guide pin holder 30. These wire guide pins 31 and 32 extend toward the gas guide surface 24a of the gas guide plate 24 and are installed so that the pins 31 and 32 are situated in planes parallel to the plane of the gas guide surface 24a at a fixed spacing on either side of the center line of the nozzle 21 fastened to the nozzle holder 22. In other words, the guide pins 31 and 32 are apart from each other so that the center of the opening of the nozzle 21 is on an imaginary line that is extended from the center of the distance between the two guide pins 31 and 32. Thus, the wire guided between these guide pins 31 and 32 is positioned in front of the center of the opening of the nozzle 21. The lower ends of the wire guide pins 31 and 32 are bent outwardly in a V-form configuration in order to facilitate insertion of the wire 14 between the pins 31 and 32 as best seen in FIG. 3.

Reference numerals 33 and 34 are wire stoppers. The wire stoppers 33 and 34 are installed perpendicularly on the supporting plate 17 (see FIG. 2) and located on both sides of the gas guide plate 24 so as to face the nozzle 21.

Furthermore, a holding block 35 is fastened to the lower end of the supporting plate 17, and a wire guide rod 36 is fastened to the holding block 35. The axis of the wire guide rod 36 is set to be parallel to the plane of the gas guide surface 24a of the gas guide plate 24.

Figure 2:
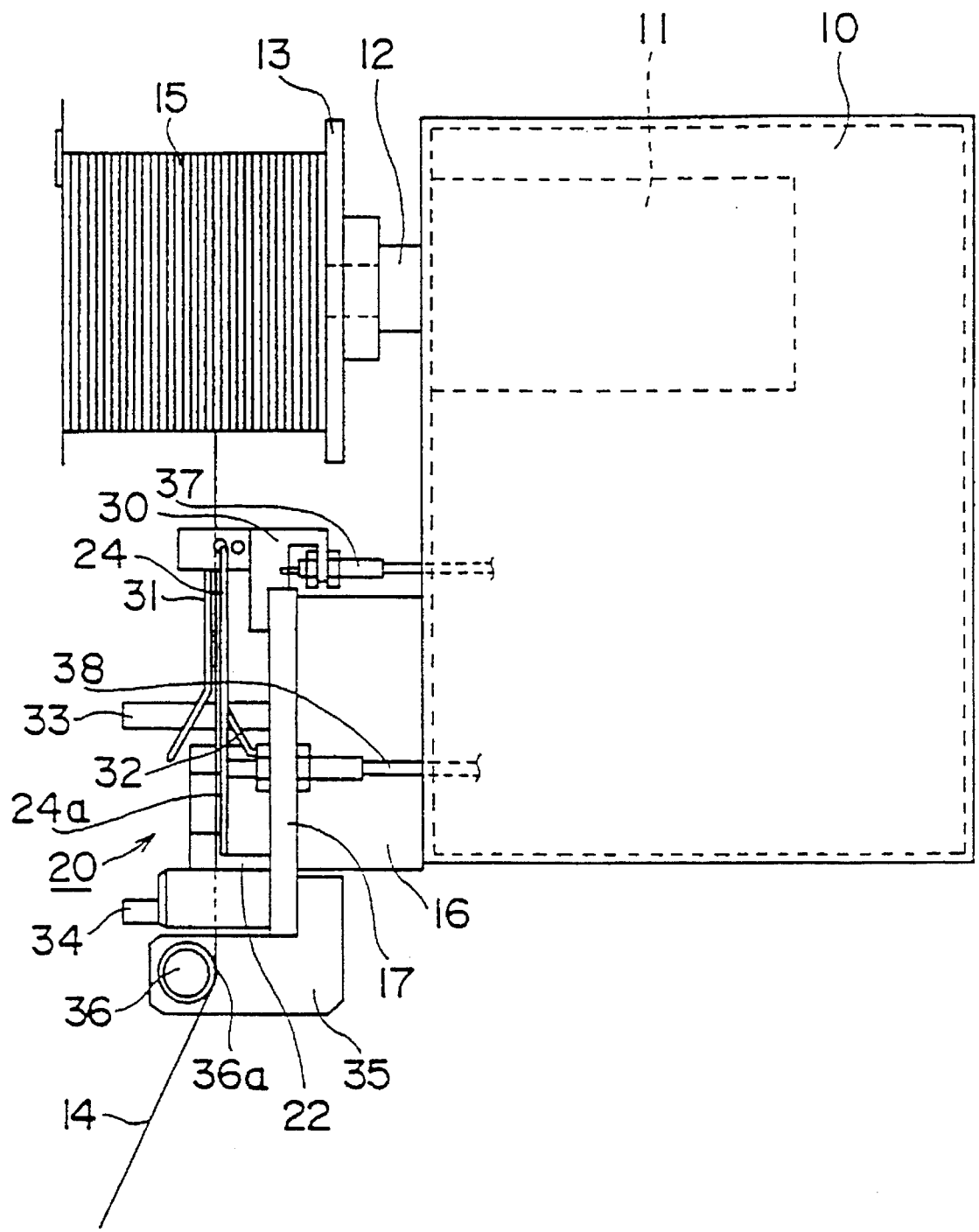
FIG. 2 is a side view of FIG. 1.

As seen in FIG. 2, one side-surface 36a of the wire guide rod 36 is situated in the same plane as the side-surface 31a of the wire guide pin 31 and is in a plane parallel to the gas guide surface 24a.

The wire guide rod 36 is not limited to a rod-form. A wire, sheet-metal member, etc. can be used instead of the guide rod 36.

Wire sensors 37 and 38 which are fiber sensors, etc. are fastened to the guide pin holder 30 and the supporting plate 17, respectively. The wire sensor 37 detects whether or not the wire 14 payed out from the spool 15 is stably fed toward the capillary 44 (described later), and the wire sensor 38 detects whether or not the wire 14 on the spool 15 has run out or the wire 14 on the spool 15 has become entangled so that it cannot be fed out.

As seen in FIG. 3, wire guides 40 and 41, a back tension means 42 which applies back tension to the wire 14, a wire clamper 43 which is closed when necessary during the wire bonding operation so as to clamp and cut the wire 14 from the attachment base of the bonding point, and a transducer 45 which holds a capillary 44 at one end, are installed beneath the wire guide rod 36. These parts, i.e., the wire guides 40 and 41, back tension means 42, wire clamper 43 and transducer 45, are installed on a bonding head of the bonding apparatus (not shown).

With the structure described above, the wire 14 payed out from the spool 15 passes between the wire guide pins 31 and 32 and over the gas guide surface 24a of the gas guide plate 24 so that the wire 14 faces (or the wire 14 is located in front of) the nozzle 21. The wire is then pulled out in the forward direction (towards left in FIG. 2) while contacting the side-surface 36a of the wire guide rod 36. The wire 14 which has thus been pulled out in the forward direction passes through the wire guides 40 and 41 and the back tension means 42 and then passes through the capillary 44 via the wire clamper 43.

The operation of the tension applying means will be described.

Since the actions of the wire guides 40 and 41, back tension means 42, wire clamper 43 and capillary 44 are the same as in the conventional devices, a description of these actions will be omitted. Also, since the actions of the wire sensors 37 and 38 have no direct relation to the feature of the present invention, these actions will be described only briefly.

In FIG. 1, when the wire 14 moves to the left away from the wire sensor 37 (i.e., toward the nozzle 21) with gas being blown out from the nozzle 21, it is an indication of insufficient paying out of the wire 14. Accordingly, the motor 11 is rotated so that the wire 14 is payed out. In cases where the wire 14 on the spool 15 runs out or where the wire on the spool 15 becomes entangled so that it cannot be payed out, the wire 14 is stretched out so that it moves from the state indicated by the solid line to the state indicated by the two-dot chain line in FIG. 1. In this case, the wire sensor 37 cannot detect the wire 14, and the wire 14 passes the wire sensor 38. Accordingly, under these conditions, a signal which stops the wire bonding operations is output.

The gas which is blown from the nozzle 21 flows along the gas guide plate 24 so as to apply tension to the wire 14 which is facing the gas being blown out. Since the gas guide plate 24 consists of a single plate, the gas from the nozzle 21 can form a stable flow along the gas guide surface 24a of the gas guide plate 24. In other words, the wire 14 is not pushed out in the direction of width of the gas guide surface 24a (i.e., in the direction perpendicular to the direction of the center line of the nozzle 21). Accordingly, the oscillation of the wire 14 can be small. Since the oscillation of the wire 14 is small, no stress is applied to the wire 14, and the wire can be payed out from the spool 15 smoothly. In this case, furthermore, the wire 14 is in contact with at least two points. In other words, it contacts the wire guide rod 36 and either the spool 15 or the wire guide pins 31 and 32. As a result, the wire can constantly be maintained in a stable state.

Furthermore, since the gas guide plate 24 consists of a single plate, conditions of contamination 50 on the guide plate 24 can be ascertained at a glance, and cleaning can easily be performed. Accordingly, the present invention is superior in terms of ease of maintenance compared to the prior art. Furthermore, there is no need for wire passing work between two wire guide plates that is required in the conventional devices; accordingly, the amount of work required can be greatly reduced. In addition, since the gas guide plate 24 consists of a single plate, the number of parts is reduced, and manufacturing costs can be reduced.

We claim:

1. A wire bonding apparatus equipped with a tension applying means which consists of a nozzle which blows out a gas and a gas guide plate which is installed along the direction of flow of said gas blown from said nozzle, said tension applying means being installed between a spool around which a wire is wound and a capillary so as to apply tension to said wire, wherein said gas guide plate consists of a single plate.

2. A wire bonding apparatus equipped with a tension applying means which consists of a nozzle which blows out a gas and a gas guide plate which is installed along the direction of flow of said gas blown from said nozzle, said tension applying means being installed between a spool around which a wire is wound and a capillary so as to apply tension to said wire, wherein said gas guide plate consists of a single plate and said tension applying means is further provided with a pair of wire guide pins and a wire guide member, said wire guide pins being parallel to a plane of said gas nozzle and installed above said gas guide plate so that said wire payed out from said spool is caused to move along a gas guide surface of said gas guide plate, and said wire guide member being installed beneath said gas guide plate and parallel to said plane of said gas guide surface of said gas guide plate, with a side-surface part of said wire guide member being situated in a same plane as a gas guide surface of said gas guide plate.

3. A device for applying tension to a bonding wire used in a wire bonding apparatus, comprising:

a nozzle for blowing out a gas to said bonding wire;

a gas guide installed near said nozzle, said gas guide consisting of a single plate having a gas guide surface thereon extending along a direction of flow of said gas blown out of said nozzle.

4. A device according to claim 3, further comprising:

a pair of wire guide pins provided above said gas guide plate so that said bonding wire is guided between said pair of wire guide pins and positioned in front of a center of an opening of said nozzle; and a wire guide bar provided beneath said gas guide plate, an axis of said wire guide bar being parallel to said gas guide plate and one side-surface of said wire guide rod being in a same plane as said gas guide surface of said gas guide plate.

* * * * *